(12) United States Patent
Mouli

(10) Patent No.: US 9,614,006 B2
(45) Date of Patent: Apr. 4, 2017

(54) SEMICONDUCTOR CONSTRUCTIONS, AND METHODS OF FORMING CROSS-POINT MEMORY ARRAYS

(71) Applicant: Micron Technology, Inc., Boise, ID (US)

(72) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/865,806

(22) Filed: Sep. 25, 2015

(65) Prior Publication Data

US 2016/0087010 A1    Mar. 24, 2016

Related U.S. Application Data

(63) Continuation of application No. 14/628,123, filed on Feb. 20, 2015, now Pat. No. 9,159,375, which is a
(Continued)

(51) Int. Cl.
*H01L 27/24* (2006.01)
*H01L 27/102* (2006.01)
(Continued)

(52) U.S. Cl.
CPC .......... *H01L 27/2463* (2013.01); *G11C 5/063* (2013.01); *G11C 13/0002* (2013.01);
(Continued)

(58) Field of Classification Search
CPC ............. H01L 27/2409; H01L 27/2418; H01L 27/2463; H01L 27/2481
See application file for complete search history.

(56) References Cited

U.S. PATENT DOCUMENTS 3,972,059 A    7/1976    Distefano
4,068,217 A    1/1978    Arnett et al.
(Continued)

FOREIGN PATENT DOCUMENTS

EP    0 660 412 A1    12/1994
EP    1 265 287 A2    12/2002
(Continued)

OTHER PUBLICATIONS

EP 09751110.9 Examination Rept, Jan. 25, 2016, Micron Technology, Inc.
(Continued)

*Primary Examiner* — Allison P Bernstein
(74) *Attorney, Agent, or Firm* — Wells St. John P.S.

(57) ABSTRACT

Some embodiments include vertical stacks of memory units, with individual memory units each having a memory element, a wordline, a bitline and at least one diode. The memory units may correspond to cross-point memory, and the diodes may correspond to band-gap engineered diodes containing two or more dielectric layers sandwiched between metal layers. Tunneling properties of the dielectric materials and carrier injection properties of the metals may be tailored to engineer desired properties into the diodes. The diodes may be placed between the bitlines and the memory elements, or may be placed between the wordlines and memory elements. Some embodiments include methods of forming cross-point memory arrays. The memory arrays may contain vertical stacks of memory unit cells, with individual unit cells containing cross-point memory and at least one diode.

18 Claims, 10 Drawing Sheets

Related U.S. Application Data continuation of application No. 12/040,546, filed on Feb. 29, 2008, now Pat. No. 8,987,702, which is a continuation-in-part of application No. 11/743,075, filed on May 1, 2007, now Pat. No. 8,487,450.

(51) Int. Cl.

| | | |
|---|---|---|
| *G11C 13/00* | (2006.01) | |
| *G11C 5/06* | (2006.01) | |
| *H01L 21/768* | (2006.01) | |
| *H01L 23/00* | (2006.01) | |
| *H01L 23/528* | (2006.01) | |
| *H01L 45/00* | (2006.01) | |

(52) U.S. Cl.
CPC .......... *G11C 13/003* (2013.01); *H01L 21/768* (2013.01); *H01L 23/528* (2013.01); *H01L 24/80* (2013.01); *H01L 27/1021* (2013.01); *H01L 45/1233* (2013.01); *H01L 45/1253* (2013.01); *H01L 45/1608* (2013.01); *G11C 2213/71* (2013.01); *G11C 2213/72* (2013.01); *G11C 2213/74* (2013.01); *H01L 27/24* (2013.01); *H01L 2924/01013* (2013.01); *H01L 2924/01014* (2013.01); *H01L 2924/01029* (2013.01); *H01L 2924/01042* (2013.01); *H01L 2924/01073* (2013.01); *H01L 2924/01074* (2013.01); *H01L 2924/01078* (2013.01); *H01L 2924/14* (2013.01)

(56) References Cited

U.S. PATENT DOCUMENTS

| | | | |
|---|---|---|---|
| 5,497,017 A | 3/1996 | Gonzales | |
| 5,512,773 A | 4/1996 | Wolf et al. | |
| 5,534,711 A * | 7/1996 | Ovshinsky | G11C 11/56 257/2 |
| 6,277,730 B1 | 8/2001 | Yuasa et al. | |
| 6,356,477 B1 | 3/2002 | Tran | |
| 6,365,959 B2 | 4/2002 | Yuasa et al. | |
| 6,479,365 B2 | 11/2002 | Wu et al. | |
| 6,534,784 B2 | 3/2003 | Eliasson et al. | |
| 6,677,207 B1 | 1/2004 | Malone | |
| 6,753,561 B1 | 6/2004 | Rinerson et al. | |
| 6,756,649 B2 | 6/2004 | Moddel et al. | |
| 6,770,516 B2 | 8/2004 | Wu et al. | |
| 6,778,421 B2 | 8/2004 | Tran | |
| 6,826,079 B2 | 11/2004 | Tran | |
| 6,944,052 B2 | 9/2005 | Subramanian et al. | |
| 6,961,258 B2 | 11/2005 | Lowrey | |
| 6,965,129 B1 | 11/2005 | Horch et al. | |
| 6,965,137 B2 | 11/2005 | Kinney et al. | |
| 7,035,141 B1 | 4/2006 | Tripsas et al. | |
| 7,042,035 B2 | 5/2006 | Rinerson et al. | |
| 7,067,862 B2 | 6/2006 | Rinerson et al. | |
| 7,071,008 B2 | 7/2006 | Rinerson et al. | |
| 7,074,692 B2 | 7/2006 | Chen et al. | |
| 7,145,790 B2 | 12/2006 | Kang | |
| 7,180,770 B2 | 2/2007 | Perner et al. | |
| 7,187,046 B2 | 3/2007 | Wu et al. | |
| 7,193,267 B2 | 3/2007 | Hsu et al. | |
| 7,220,983 B2 | 5/2007 | Lung et al. | |
| 7,320,895 B1 | 1/2008 | Horch et al. | |
| 7,326,986 B2 | 2/2008 | Cheng et al. | |
| 7,388,276 B2 | 6/2008 | Estes | |
| 7,400,006 B1 | 7/2008 | Rinerson et al. | |
| 7,408,212 B1 | 8/2008 | Luan et al. | |
| 7,445,988 B2 | 11/2008 | Cheng et al. | |
| 7,473,986 B2 | 1/2009 | Ang et al. | |
| 7,525,832 B2 | 4/2009 | Muraoka et al. | |
| 7,577,022 B2 | 8/2009 | Muraoka et al. | |
| 7,706,167 B2 | 4/2010 | Toda | |
| 7,719,875 B2 | 5/2010 | Toda | |
| 7,755,934 B2 | 7/2010 | Toda | |
| 7,858,506 B2 | 12/2010 | Sandhu et al. | |
| 7,859,885 B2 | 12/2010 | Toda | |
| 8,102,699 B2 | 1/2012 | Toda | |
| 8,120,951 B2 | 2/2012 | Mouli | |
| 8,134,194 B2 | 3/2012 | Mouli | |
| 8,294,219 B2 | 10/2012 | Malhotra et al. | |
| 8,502,291 B2 | 8/2013 | Mouli | |
| 8,907,318 B2 | 12/2014 | Sonehara et al. | |
| 2002/0079524 A1 | 6/2002 | Dennison | |
| 2002/0089024 A1 | 7/2002 | Iwata | |
| 2002/0196659 A1 | 12/2002 | Hurst et al. | |
| 2003/0189851 A1 | 10/2003 | Brandenberger et al. | |
| 2003/0203585 A1 | 10/2003 | Hsu | |
| 2004/0100817 A1 | 5/2004 | Subramanian et al. | |
| 2004/0159828 A1 | 8/2004 | Rinerson et al. | |
| 2004/0159867 A1 | 8/2004 | Kinney et al. | |
| 2004/0159868 A1 | 8/2004 | Rinerson et al. | |
| 2004/0159869 A1 | 8/2004 | Rinerson et al. | |
| 2004/0161888 A1 | 8/2004 | Rinerson et al. | |
| 2005/0112846 A1 | 5/2005 | Meyer et al. | |
| 2005/0128798 A1 | 6/2005 | Kang | |
| 2005/0158950 A1 | 7/2005 | Scheuerlein et al. | |
| 2005/0207248 A1 | 9/2005 | Hsu | |
| 2005/0275106 A1 | 12/2005 | Fricke et al. | |
| 2006/0050581 A1 | 3/2006 | Luk et al. | |
| 2006/0203541 A1 | 9/2006 | Toda | |
| 2006/0249753 A1 | 11/2006 | Herner et al. | |
| 2006/0273429 A1 | 12/2006 | Sakamoto et al. | |
| 2007/0015348 A1 | 1/2007 | Hsu et al. | |
| 2007/0069276 A1 | 3/2007 | Scheuerlein et al. | |
| 2007/0070690 A1 | 3/2007 | Scheuerlein et al. | |
| 2007/0090425 A1 | 4/2007 | Kumar et al. | |
| 2007/0139987 A1 | 6/2007 | Kouchiyama et al. | |
| 2007/0221953 A1 | 9/2007 | Sakamoto | |
| 2007/0240995 A1 | 10/2007 | Odagawa et al. | |
| 2007/0267667 A1 | 11/2007 | Ufert | |
| 2007/0285964 A1 | 12/2007 | Toda et al. | |
| 2007/0285969 A1 | 12/2007 | Toda | |
| 2007/0285970 A1 | 12/2007 | Toda | |
| 2007/0285971 A1 | 12/2007 | Toda | |
| 2008/0112211 A1 | 5/2008 | Toda | |
| 2008/0212359 A1 | 9/2008 | Muraoka et al. | |
| 2008/0273363 A1 | 11/2008 | Mouli | |
| 2008/0318397 A1 | 12/2008 | Herner | |
| 2009/0001343 A1 | 1/2009 | Schricker et al. | |
| 2009/0067215 A1 | 3/2009 | Muraoka et al. | |
| 2009/0166609 A1 | 7/2009 | Schricker et al. | |
| 2009/0242865 A1 | 10/2009 | Lung et al. | |
| 2010/0078758 A1 | 4/2010 | Sekar et al. | |
| 2011/0080778 A1 | 4/2011 | Toda | |
| 2012/0099370 A1 | 4/2012 | Toda | |

FOREIGN PATENT DOCUMENTS

| | | |
|---|---|---|
| GB | 2 409 336 A | 6/2005 |
| KR | 2005-0058930 | 6/2005 |
| KR | 2005-0110680 | 11/2005 |
| KR | 2008-0005443 | 1/2008 |
| WO | WO 2004/084228 | 9/2004 |
| WO | WO 2006/055482 | 5/2006 |
| WO | WO 2006/114904 | 11/2006 |
| WO | WO 2008/134205 | 11/2008 |
| WO | PCT/US2008/059661 | 11/2009 |
| WO | PCT/US2009/035006 | 8/2010 |
| WO | PCT/US2009/042168 | 11/2010 |
| WO | PCT/US2009/042236 | 11/2010 |

OTHER PUBLICATIONS

CN 2009801181514 SR Trans, May 28, 2013, Micron Technology, Inc.

EP 08 733 169.0 Search Report, Apr. 6, 2010, Micron Technology, Inc.

EP 09 75 1110 Sup Search Rept, Jun. 21, 2012, Micron Technology, Inc.

EP 09751113.3 Search Report, May 2, 2011, Micron Technology, Inc.

(56) References Cited

OTHER PUBLICATIONS

PCT/US2008/059661 Search Rept., Jul. 18, 2008, Micron Technology, Inc.
PCT/US2008/059661 Writ. Opin., Jul. 18, 2008, Micron Technology, Inc.
PCT/US2009/035006 Search Rept., Jun. 26, 2009, Micron Technology, Inc.
PCT/US2009/035006 Writ. Opin., Jun. 29, 2009, Micron Technology, Inc.
PCT/US2009/042168 Search Rept., Sep. 30, 2009, Micron Technology, Inc.
PCT/US2009/042168 Writ. Opin., Sep. 30, 2009, Micron Technology, Inc.
PCT/US2009/042236 Search Rept., Dec. 15, 2009, Micron Technology, Inc.
PCT/US2009/042236 Writ. Opin., Dec. 15, 2009, Micron Technology, Inc.
TW 097114674 Search Rept Trans, Aug. 26, 2011, Micron Technology, Inc.
TW 098106558 Search Rept Trans, Mar. 1, 2013, Micron Technology, Inc.
TW 098115904 Search Rept Trans, Feb. 20, 2013, Micron Technology, Inc.
TW 098115926 Search Rept Trans, Sep. 26, 2012, Micron Technology, Inc.
TW 098115926 Search Rept Trans, Jun. 20, 2013, Micron Technology, Inc.
Asamitsu et al., "Current Switching of Resistive States in Magnetoresistive Manganites", Letters to Nature vol. 388, No. 6637, Jul. 3, 1997, United Kingdom, pp. 50-52.
Daughton, "Magnetoresistive Random Access Memory (MRAM)", © Feb. 4, 2000, United States, 13 pages.
Feng, "Evaluation of SiO2 Antifuse in a 3D-OTP Memory", Sep. 3, 2004, IEEE Transactions on Device and Materials Reliability vol. 4, United States, pp. 419-421.
Hobbs et al., "Fermi-Level Pinning at the Polysilicon/Metal Oxide Interface—Part I", Jun. 6, 2004, IEEE Transactions on Electron Devices vol. 51, United States, pp. 971-977.
Hu et al. Am. Chem. Soc. vol. 129, No. 13, p. 3863-3878. Apr. 4, 2007.
Lee et al., "Two Series Oxide Resistors Applicable to High Speed and High Density Nonvolatile Memory", Advanced Materials vol. 19, No. 22, 2007, Germany, pp. 3919-3923.
National Physical Laboratory, "Kaye & Laby Tables of Physical & Chemical Constants", Chapter 4.3 Work Function, online at http://www.kayelabynpl.co.uk /atomic_and_nuclear_physics/4_3/4_3. html, Oct. 16, 2014, 3 pages.
Strehlow et al., "Compilation of Energy Band Gaps in Elemental and Binary Compound Semiconductors and Insulators", Journal of Physical and Chemical Reference Data vol. 2, No. 1, 1973, United States, pp. 163-199.
Table of Melting Temperatures of Metals, retrieved online at www.engineeringtoolbox.com Mar. 19, 2012, 2 pages.
KR10-20107026077 Search Report, Jun. 17, 2012, Micron Technology, Inc.

\* cited by examiner

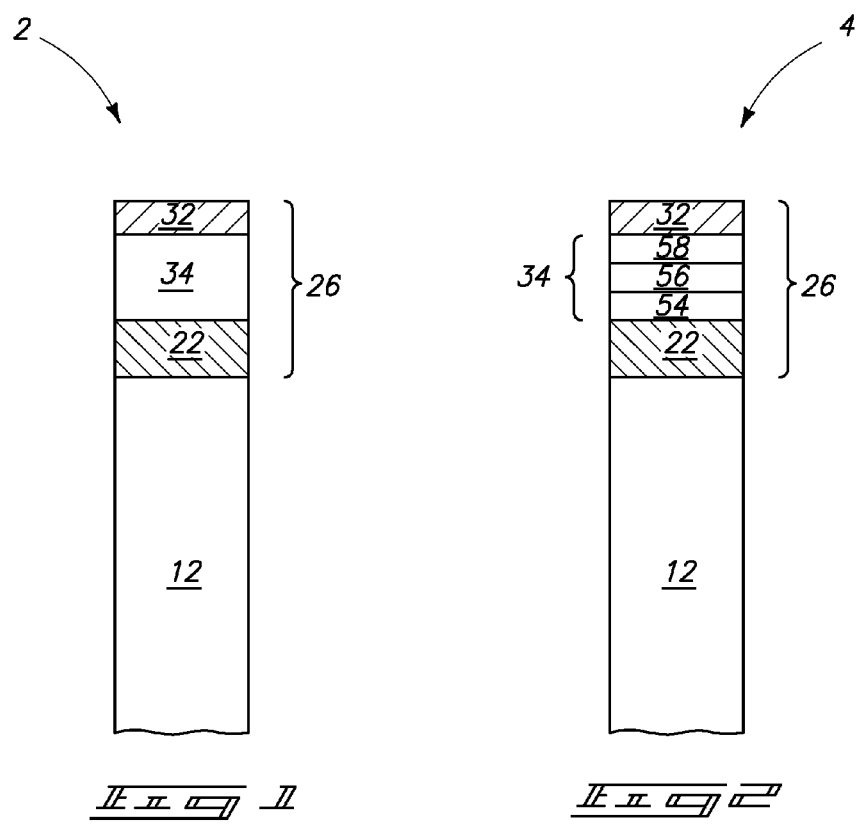
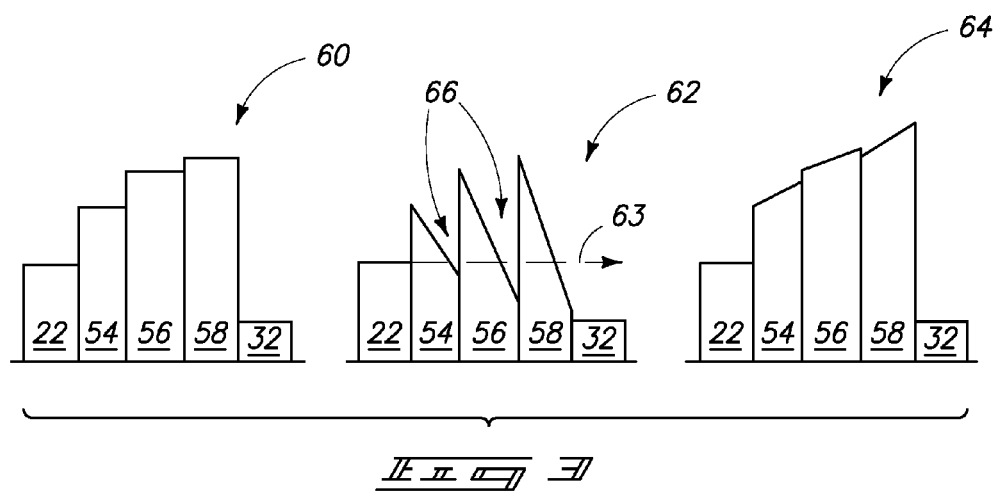

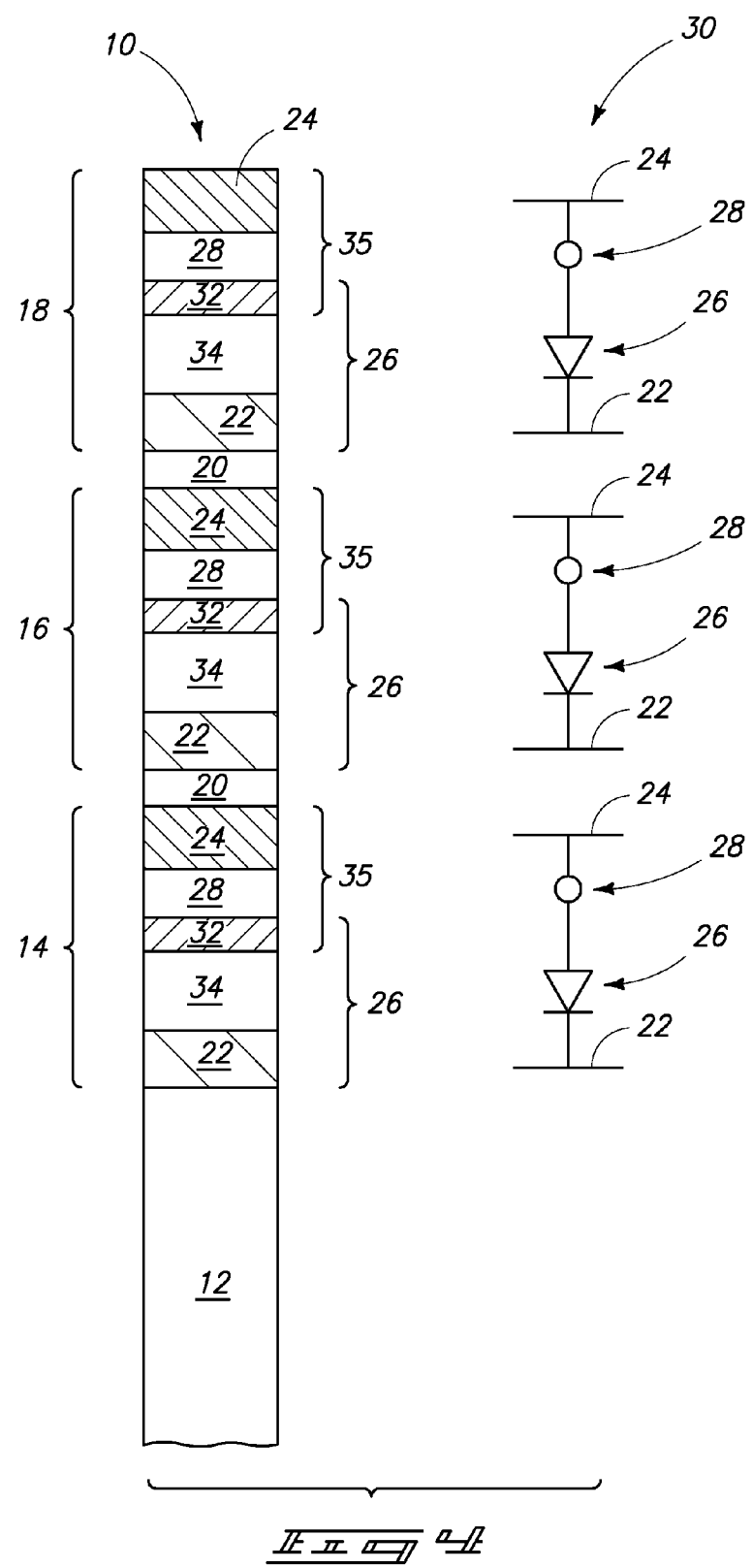

US 9,614,006 B2

SEMICONDUCTOR CONSTRUCTIONS, AND METHODS OF FORMING CROSS-POINT MEMORY ARRAYS

RELATED PATENT DATA

This patent resulted from a continuation of U.S. patent application Ser. No. 14/628,123 which was filed Feb. 20, 2015, which is a continuation of U.S. patent application Ser. No. 12/040,546 which was filed Feb. 29, 2008, now U.S. Pat. No. 8,987,702, which is a continuation-in-part of U.S. patent application titled "Semiconductor Constructions, Electronic Systems, and Methods of Forming Cross-Point Memory Arrays," filed on 1 May 2007 having Ser. No. 11/743,075, now U.S. Pat. No. 8,487,450, each of which is incorporated by reference herein.

TECHNICAL FIELD

Semiconductor constructions, electronic systems, and methods of forming cross-point memory arrays.

BACKGROUND

A continuing goal of integrated circuit fabrication is to decrease the amount of semiconductor real estate consumed by integrated circuit devices, and to thereby increase the level of integration.

Memory may utilize a large array of memory devices. Accordingly, reduction in the size of individual memory devices may translate into a large increase in the bit density. Common memory devices are dynamic random access memory (DRAM) devices, static random access memory (SRAM) devices, and nonvolatile devices (so-called flash devices). The nonvolatile devices may be incorporated into NAND or NOR memory array architectures.

The size of a memory device may be expressed in terms of the smallest feature size utilized in fabrication of the memory device. Specifically, if the smallest feature size is designated as "F", the memory device dimensions may be expressed in units of $F^2$. Conventional DRAM memory frequently comprises dimensions of at least $6F^2$, and SRAM may require even more semiconductor real estate.

A type of memory that potentially consumes very little semiconductor real estate is so-called cross-point memory. In cross-point memory, a memory cell occurs at overlap between a wordline and a bitline. Specifically, a material which undergoes a stable and detectable change upon exposure to current is provided between the wordline and bitline. The material may be, for example, a perovskite material, a chalcogenide material, an ionic transport material, a resistive switching material, a polymeric material and/or a phase change material. Since the memory cell may be confined to a region of overlap of a bitline and wordline, the memory cell may theoretically be formed to dimensions of $4F^2$ or less.

Problems encountered in closely packing cross-point memory may include disturbance mechanisms (or so-called cross-talk) occurring when data transfer to or from one memory cell influences a neighboring memory cell.

It is desired to develop improved methods for forming highly-integrated circuitry, and to develop improved highly-integrated circuit constructions.

BRIEF DESCRIPTION OF THE DRAWINGS

FIG. 1 is diagrammatic cross-sectional view of a portion of a construction in accordance with an embodiment.

FIG. 2 is diagrammatic cross-sectional view of a portion of a construction in accordance with an embodiment.

FIG. 3 shows three band-gap diagrams illustrating three different bias conditions of a diode in accordance with an embodiment.

FIG. 4 is diagrammatic cross-sectional view of a portion of a semiconductor construction in accordance with an embodiment. FIG. 4 also shows a schematic electrical diagram of some of the components of the cross-section.

FIG. 9 also shows a schematic electrical diagram of some of the components of the cross-section.

FIG. 10 also shows a schematic electrical diagram of some of the components of the cross-section.

DETAILED DESCRIPTION OF THE ILLUSTRATED EMBODIMENTS

Figure 5:
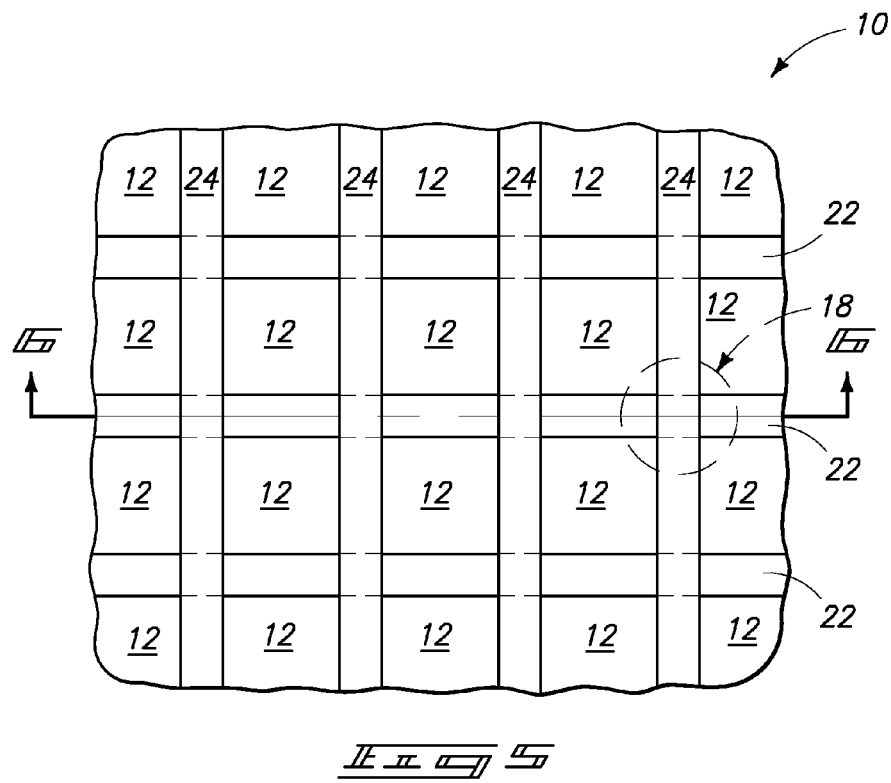
FIGS. 5 and 6 are a diagrammatic top view and a cross-sectional side view, respectively, of an array of cross-point memory cells in accordance with an embodiment. The cross-section of FIG. 6 is along the line 6-6 of FIG. 5. The portion of FIG. 4 is shown to be part of the portions of FIGS. 5 and 6; with the portion of FIG. 4 being within a dashed-line area designated as "4."

In some embodiments, cross-point memory cells are formed to include diodes. The diodes may be configured to enable current to pass to or from a portion of the memory cell, while also alleviating, and possibly preventing, cross-talk between adjacent devices. The diodes may contain stacked thin dielectric films, with the dielectric films being band-structure engineered to achieve tailored diode properties for particular memory cells.

It may be advantageous to utilize stacked dielectric materials for the diodes rather than utilizing conventional silicon-based n-p junction diodes. The conventional silicon-based junction diodes may be limited relative to bandgap, Shockley-Read-Hall (SRH) generation and recombination rates, active doping concentrations, injection velocity, carrier lifetime and breakdown strength (or other high field properties such as ionization rates, etc.).

The cross-point memory cells may be arranged in vertical stacks. Stacking of the memory cells may substantially reduce the real estate consumption attributed to individual memory cells. For instance, if two $4F^2$ memory cells are stacked such that one is directly over the other, than the amount of semiconductor real estate consumed by each is effectively cut in half so that the individual memory cells are essentially only consuming $2F^2$ of semiconductor real estate. The reduction in effective real estate consumption increases proportionally to the number of vertically-stacked memory cells. Thus, significant strides in integration may be achieved by vertically stacking at least some of the memory cells of a memory cell array.

The stacked memory cells may be utilized as nonvolatile memory, and may correspond to single level cells (SLCs) or multilevel cells (MLCs). Such nonvolatile memory may be incorporated into NAND memory arrays. In embodiments in which multi-stacked multilevel cells (MS-MLCs) are formed, the memory may prove to be particularly low-cost, high-performance and high-density. The stacked cells may be routed through multi-level interconnects.

In some embodiments, the fabrication of memory cells is conducted over a silicon substrate utilizing low-temperature deposition processes, and with few if any high temperature dopant activation steps. Avoidance of high-temperature processing may alleviate thermally-induced damage to integrated circuit devices. Also, many of the materials showing promise for utilization as memory elements in cross-point memory cells (for instance, $Ge_2Se_2Te_5$ and other chalcogenides, various metal oxides, etc.) lack high-temperature stability.

Example embodiments are described with reference to FIGS. 1-14.

Referring to FIG. 1, a fragment of a semiconductor construction 10 is illustrated. The fragment comprises a base 12 and a plurality of cross-point memory units 14, 16 and 18 over the base. Adjacent memory units are spaced from one another by passivation material 20.

Base 12 may comprise semiconductor material, and in some embodiments may comprise, consist essentially of, or consist of monocrystalline silicon. The base may be referred to as a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although base 12 is shown to be homogenous, it may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc. In some embodiments, an uppermost region of the base may comprise an electrically insulative material so that a conductive layer of the memory unit 14 is directly against such insulative material.

In some embodiments, base 12 may correspond to semiconductor-on-insulator (SOI).

A schematic electrical diagram 30 is shown adjacent fragment 10 to illustrate some of the electrical components of the fragment. The electrical diagram shows that the memory units 14, 16 and 18 individually comprise a wordline 22, a bitline 24, a diode 26 and a memory element 28.

The wordlines and bitlines 22 and 24 are shown in semiconductor construction 10 to comprise electrically conductive material. Such electrically conductive material may comprise any suitable composition or combination of compositions, including one or more of various metals (for instance, tantalum, platinum, tungsten, aluminum, copper, gold, etc.), metal-containing compositions (for instance, metal nitrides, metal silicides, etc.), and conductively-doped semiconductor materials (for instance, conductively-doped silicon). The individual wordlines and bitlines may have thicknesses of from about 2 nanometers to about 20 nanometers.

The memory elements 28 may comprise any suitable composition or combination of compositions, and may, for example, comprise, consist essentially of, or consist of one or more of perovskite materials, chalcogenide materials, ionic transport materials, resistive switching materials, polymeric materials and phase change materials.

The memory elements 28, conductive material 32 and bitlines 24 together form memory components 35. Current within one or both of the conductive materials 32 and 24 of the memory components 35 may be utilized to change a state of memory element 28 in a writing operation, or to ascertain a state of the memory element 28 in a reading operation.

The conductive material 32, insulative material 34 and wordlines 22 together form diodes 26.

The conductive material 32 is overlapped by the memory components 35 and the diodes 26. In some embodiments, the conductive material 32 may be referred to as conductive diode material (or in other words, as a diode electrode), even though material 32 is also part of the memory components. Conductive material 32 may comprise any suitable composition or combination of compositions, and may, for example, comprise, consist essentially of, or consist of one or more of various metals (for instance, tantalum, platinum, tungsten, aluminum, copper, gold, etc.), metal-containing compositions (for instance, metal nitrides, metal silicides, etc.), and conductively-doped semiconductor materials (for instance, conductively-doped silicon). The conductive material 32 may have a thickness of from about 2 nanometers to about 20 nanometers.

The insulative material 34 may be referred to as diode dielectric material, and may comprise any suitable composition or combination of compositions. In some embodiments, the insulative material comprises a stack of electrically insulative layers, with the individual layers having band gap and/or band-alignment properties tailored for the particular application of the diode. The layers may have individual thicknesses of from about 0.7 nanometers to about 5 nanometers; and may comprise, consist essentially of, or consist of one or more compositions selected from the group consisting of aluminum oxide, silicon oxide, silicon nitride, zirconium oxide and hafnium oxide. The oxide and nitrides are referred to in terms of the principal components, rather than in terms of specific stoichiometries. Accordingly, the oxide of silicon is referred to as silicon oxide, which encompasses the stoichiometry of silicon dioxide.

Tunneling properties of the insulative materials (for instance, materials 34), and/or carrier injection properties of the conductive materials 22 and 32, may be tailored to engineer desired properties into the diodes.

The diodes are shown between the wordlines and the memory elements. In other embodiments, the diodes may be additionally, or alternatively, provided between the bitlines and the memory elements.

In the shown embodiment, the rectifying diodes permit current flow from the memory elements to the wordlines, but restrict current flow in the opposing direction. Such can enable reading to and writing from individual memory elements, while limiting cross-talk between adjacent memory elements. The cross-talk is further restricted by the provision of passivation material 20 between the adjacent memory units. The passivation material may comprise any suitable composition or combination of compositions, and may, for example, comprise, consist essentially of, or consist of one or more of silicon dioxide, silicon nitride, silicon oxynitride, and organic material (for instance, polyimide, amorphous carbon, photoresist, etc.).

Although the diodes are shown oriented to direct current flow from the memory elements to the wordlines, in other embodiments the orientation of the diodes may be reversed. Accordingly, the diodes may be oriented to permit current flow from the wordlines to the memory elements, and to restrict current flow in the opposing direction. Such configuration may also enable reading to and writing from individual memory elements, while limiting cross-talk between adjacent memory elements.

The memory units may be incorporated into an array comprising both vertical stacking of memory units and horizontal arrangement of the units, as shown in FIGS. 2 and 3.

FIGS. 2 and 3 show the portion of FIG. 1 as part of a larger portion of construction 10. The memory units 14, 16 and 18 are labeled in the cross-section of FIG. 3, and are shown to be part of an array comprising a plurality of identical columns of memory units.

The bitlines 24 are shown to extend substantially orthogonally to the wordlines 22. The term "substantially orthogonally" means that the bitlines and wordlines are more orthogonal to one another than not, which can include, but is not limited to, embodiments in which the wordlines and bitlines are entirely exactly orthogonal to one another.

The bitlines 24 are shown to be vertically interlaced with the wordlines, with individual bitlines being paired with individual wordlines in the memory units. The vertical interlacing of the bitlines and wordlines more specifically comprises individual bitlines interjacent pairs of wordlines, and individual wordlines interjacent pairs of bitlines. In other words, the wordlines and bitlines alternate with one another throughout the vertical stacks.

The embodiment of FIGS. 2 and 3 may be fabricated as follows.

Initially, a first level of wordlines is formed over a semiconductor base (or substrate) 12. The first level of wordlines may be patterned by utilizing photolithographic processing and one or more etches to pattern wordline material into a plurality of lines.

Subsequently, a first level of diode dielectric material 34 (which may be a stack of multiple dielectric layers) is formed over the first level of wordlines. The diode dielectric material may be deposited across the wordlines and spaces between the wordlines, and then patterned utilizing photolithographic processing and one or more etches to create the shown configuration in which the diode dielectric material is only at cross-points of the wordlines and bitlines. In some embodiments, the diode dielectric material may be left between the wordlines rather than patterned to be only at cross-points of the wordlines and bitlines. The diode dielectric may be deposited with any suitable methodology, including, for example, atomic layer deposition (ALD).

A first level of electrically conductive diode material (i.e., a diode electrode) 32 is then formed over the diode dielectric material. The electrically conductive material 32 may be formed in the shown configuration by depositing the material and then patterning it with a photolithographically patterned mask and one or more etches.

A first level of memory elements 28 is formed over the first level of conductive diode material. The memory elements may be formed by depositing memory element material across the wordlines and spaces between the wordlines, and then patterning the memory element material utilizing photolithographic processing and one or more etches to create the shown configuration in which the memory element material is only at cross-points of the wordlines and bitlines. In some embodiments, the memory element material may be left between the wordlines rather than patterned to be only at cross-points of the wordlines and bitlines.

A first level of bitline material is formed over the first level of memory elements. The bitline material may be deposited across the wordlines and spaces between the wordlines, and then patterned utilizing photolithographic processing and one or more etches to create the shown configuration in which the bitlines are substantially orthogonal to the wordlines.

Subsequent levels of wordlines, diode dielectric, conductive diode material, memory elements and bitlines may be formed using subsequent iterations of the above-discussed processing to form vertically-stacked memory arrays to desired heights. In some embodiments, the vertical stacks may comprise at least 3 memory units, at least 10 memory units, or at least 15 memory units.

The vertically-stacked memory units may be identical to one another, or may differ from one another. For instance, the diode material utilized for memory units at one level of a vertical stack may be different in composition from the diode material utilized for memory units at another level of a vertical stack; or may be the same composition as the diode material utilized for the memory units at the other level of the vertical stack.

The configuration of FIGS. 2 and 3 has the diodes provided between the wordlines and the memory elements. In other configurations, the diodes may be provided between the memory elements and the bitlines. The fabrication process utilized to form such other configurations may be similar to that utilized to form the configuration of FIGS. 2 and 3, except that the conductive diode material and diode dielectric material will be formed after formation of the memory elements rather than before formation of the memory elements. In yet other embodiments, the orientation of the wordlines and bitlines in the memory units may be reversed (so that the bitlines are under the wordlines) and the diodes may be formed either between the wordlines and the memory elements, or between the bitlines and the memory elements.

FIG. 4 is a schematic circuit diagram of one level of the embodiment of FIGS. 2 and 3. FIG. 4 shows the memory elements 28 and diodes 26 between wordlines 22 and bitlines 24, and further shows the diodes connected between the memory elements and the wordlines.

FIG. 5 shows an example cross-point memory cell 50 illustrating an embodiment of a diode that may be utilized. Similar numbering will be used in referring to FIG. 5 as is utilized above in describing FIGS. 1-4, where appropriate.

The cross-point memory cell is formed over a semiconductor base 12. The memory cell comprises a wordline 22, diode dielectric material 34, electrically conductive diode material 32, a memory element 28 and a bitline 24.

The conductive diode material 32, memory element 28 and bitline 24 together form a memory component 52. Current within one or both of the conductive materials 32 and 24 of the memory component may be utilized to change a state of memory element 28 in a writing operation, or to ascertain a state of the memory element 28 in a reading operation.

The wordline 22, diode dielectric material 34 and electrically conductive diode material 32 together form a diode 26. The electrically conductive materials 22 and 32, and diode dielectric material 34, may be tailored to impart desired properties to the diode.

In the shown embodiment, the diode dielectric material 34 comprises a stack of three different dielectric materials 54, 56 and 58. Such materials may be tailored relative to one another so that band gaps, and/or conduction band edges, and/or valence band edges, between the materials enable tunneling of carriers in one direction through the materials, but not in an opposing direction.

The dielectric materials 54, 56 and 58 may comprise any suitable materials, and may, for example, comprise one or more compositions selected from the group consisting of aluminum oxide, silicon oxide, silicon nitride, zirconium oxide and hafnium oxide.

Although the example diode 26 of FIG. 5 has three different dielectric materials (54, 56 and 58), in other embodiments the diode may comprise other than three different dielectric materials. Specifically, in some embodiments the diode may comprise more than three different dielectric materials, and in other embodiments the diode may comprise less than three different dielectric materials.

Figure 6:
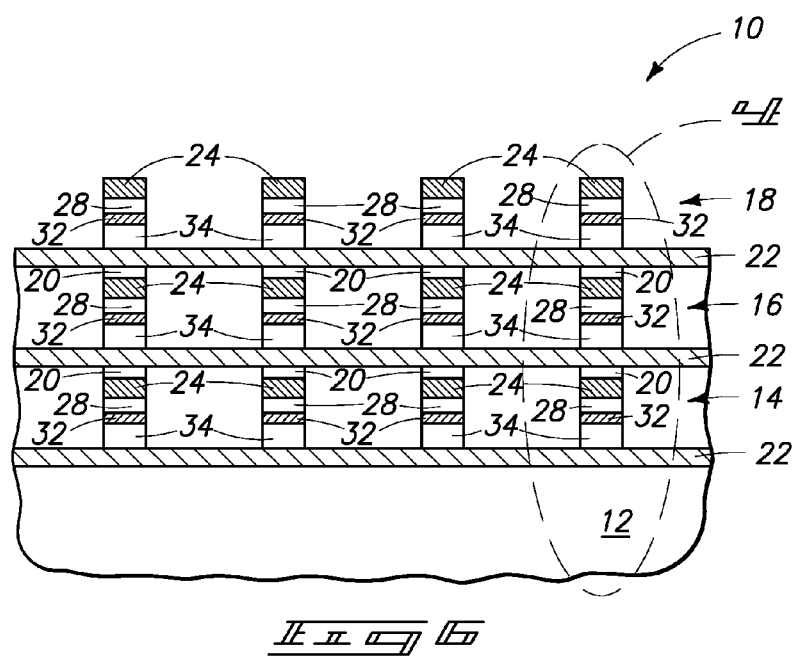

FIG. 6 shows band gap diagrams of diode 26 in an unbiased condition (diagram 60), a forward biased condition (diagram 62) and a reverse biased condition (diagram 64). Diagrams 60 and 64 shows that in an unbiased condition, and in a reverse biased condition, bands from dielectric materials 58, 56 and 54 preclude migration of carriers between conductive materials 22 and 32. In contrast, diagram 62 shows that tunneling may occur in a forward biased condition so that carriers (specifically electrons in the shown embodiment) may tunnel from conductive material 22 to conductive material 32. The flow of the electrons is diagrammatically illustrated with a dashed arrow 63 in FIG. 6. It is noted that the diodes are shown in FIGS. 1 and 4 are oriented for current flow from conductive material 32 to conductive material 22. Such is consistent with the diagrams of FIG. 6 which illustrate electron flow from conductive material 22 to conductive material 32 (in other words, in an opposite direction to the current flow). In other embodiments, the diodes may be reversed so that the electron flow in the forward-biased condition is from conductive material 32 to conductive material 22.

The diode described in FIGS. 5 and 6 may be considered to be band-gap engineered in that compositions of materials 22, 32, 54, 56 and 58 are chosen so that the forward-biased tunneling of diagram 62 occurs. Some example compositions suitable for the band-gap engineered diodes are aluminum for material 22, aluminum oxide for material 58, silicon dioxide for material 56, silicon nitride for material 54, and tungsten for material 32. Another set of exemplary compositions is molybdenum for material 22, silicon dioxide for material 58, silicon nitride for material 56, hafnium oxide for material 54 and platinum for material 32. Another set of exemplary compositions is platinum for material 22, silicon dioxide for material 58, hafnium oxide for material 56, zirconium oxide for material 54 and nickel for material 32.

The band structures of FIG. 6 may be considered engineered band structures. Heterostructures may be formed by molecular beam epitaxy (MBE) growth of III/V materials. In dielectric materials, a band gap may be engineered through thermal treatments (such as thermal treatment of aluminum oxides), as is known for nonvolatile memory cells (such as "crested barrier" cells and VARIOT flash cells). The band gap engineered structures may exploit characteristics of band-edge discontinuities in carrier transport in the semiconductor, and/or may exploit characteristics of band-edge discontinuities in charge storage of the dielectric. For nonvolatile memory cells, this may enable optimization of retention, and endurance characteristics.

Deposition of thin layers of dielectric material may create local quantum wells which may be exploited in the diode structures described herein. The conduction band and valence band edges of the dielectrics may be engineered by material choice and/or thermal treatments. Fermi-level pinning in the metal region may be engineered by tailoring the compositions of the conductive materials at the tops and bottoms of the diodes. The barrier heights along the dielectric thickness may determine the tunneling characteristics of the structures.

In a forward biased condition, quantum wells might form between conductive materials at the tops and bottoms the diodes (with such conductive materials being the electrodes of the diodes). The quantum wells will have discrete energy levels. The contact between one electrode and an adjacent dielectric will have a first Fermi level. When energy is provided the state may be raised to a first allowed quantum energy level, which may dramatically increase the probability of carrier tunneling. This may lead to an effective lowering of the potential barrier in the dielectric. In a reverse bias condition, the potential barrier is high and formation of any quantum well is suppressed. There is, therefore, a low probability for conduction current to flow from one metal to another—due to reduced tunneling, which approaches zero—if the dielectric thickness is appropriately tailored.

If different thin film dielectric materials are sandwiched between electrodes, there may be multiple quantum wells under a forward bias condition. Tunneling characteristics across such structures indicate that there may be a sharp turn-on characteristic when the Fermi level corresponds to a lowest allowed quantum energy level. The results may be modified in the presence of phonons at higher temperatures, but a non-linear characteristic may result from such structure.

Tunneling may be a very fast process, and may occur in femtoseconds. Tunneling may also be relatively independent of temperature. Accordingly, thin film diodes of the type described herein may be able to be switched very fast, and to meet high temperature reliability criteria.

Figure 7:
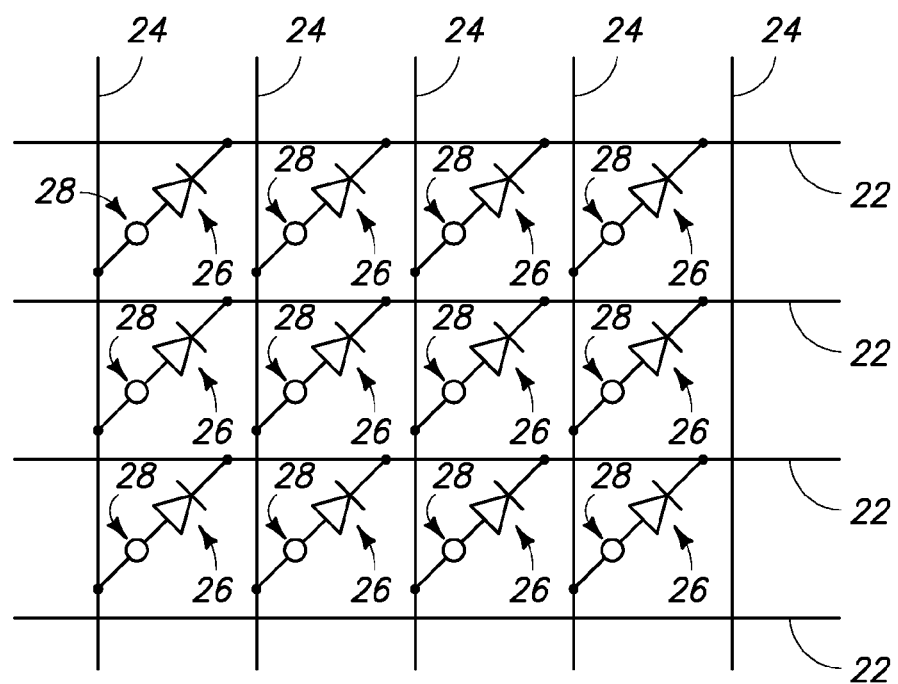
FIG. 7 is a schematic electrical diagram of an array of memory elements in accordance with an embodiment.

The memory cells of FIGS. 1-5 have a single diode in each memory unit cell. In other embodiments, multiple diodes may be utilized in a single memory unit cell. For instance, a pair of diodes may be provided in back-to-back arrangement to provide silicon controlled rectifier (SCR) type properties. FIG. 7 illustrates a memory unit cell comprising a back-to-back diode arrangement. In referring to FIG. 7, similar numbering will be used as is used above in describing FIGS. 1-5, where appropriate.

FIG. 7 shows a portion 70 of a semiconductor construction, and shows a schematic electrical diagram 72 adjacent the portion 70 to illustrate electrical components comprised by the portion 70. The schematic electrical diagram 72 shows that the portion comprises a wordline 22, a bitline 24, a memory element 28, a first diode 74 and a second diode 76. The first and second diodes are adjacent one another, and in back-to-back orientation relative to one another.

The portion 70 comprises base 12, memory component 52 (containing bitline 24, memory element 28, and conductive material 32), and the diodes 74 and 76 between the memory component and the wordline. The diode 74 comprises diode dielectric materials 80, 82 and 84; and the diode 76 comprises diode dielectric materials 90, 92 and 94. Dielectric materials 80, 82, 84, 90, 92 and 94 may comprise any of the compositions discussed above for diode dielectric materials.

A conductive material 98 is between the diodes, and bridges the diodes with one another. The conductive material may comprise any suitable composition, and may, for example, comprise one or more metals (for instance, one or more of tantalum, platinum, tungsten, aluminum, copper and gold) and/or one or more metal-containing compositions (for instance, metal silicide or metal nitride).

Figure 8:
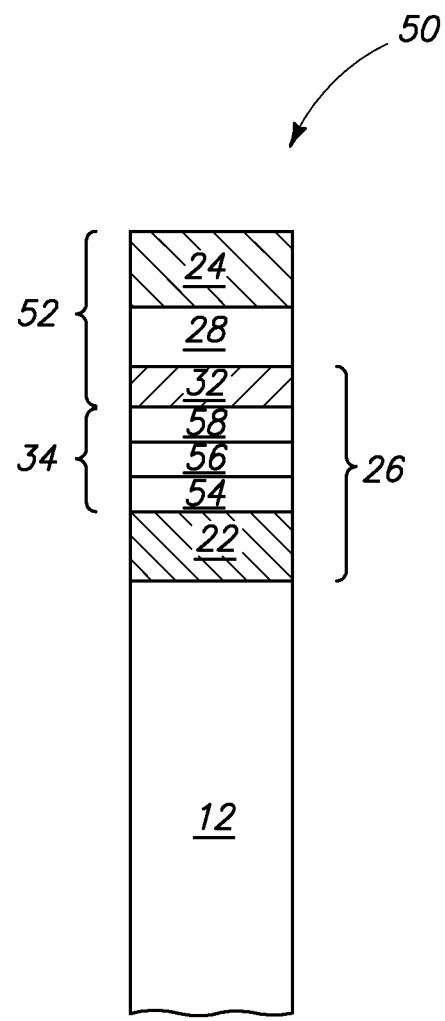
FIG. 8 is diagrammatic cross-sectional view of a portion of a semiconductor construction in accordance with an embodiment.

The embodiments of FIGS. 1-7 specifically show diodes provided between wordlines and memory elements. As discussed above, the diodes may be additionally, or alternatively, provided between the bitlines and the memory elements. FIG. 8 illustrates an embodiment in which vertically-stacked memory cells have diodes provided between bitlines and memory elements. Similar numbering will be used to describe FIG. 8 as is utilized in describing FIGS. 1-7, where appropriate.

FIG. 8 shows a portion 100 of a semiconductor construction, and shows a schematic electrical diagram 102 adjacent the portion 100 to illustrate electrical components comprised by the portion 100. The schematic electrical diagram 102 shows that the portion comprises wordlines 22, bitlines 24, memory elements 28, and diodes 26.

The portion 100 comprises base 12, memory components 101 (containing wordlines 22, memory elements 28, and conductive material 32), diodes 26, and passivation 20 between adjacent memory cells. The diodes 26 comprise diode dielectric materials 104, 106 and 108. Dielectric materials 104, 106 and 108 may comprise any of the compositions discussed above for diode dielectric materials.

The memory cells discussed with reference to FIGS. 1-8 may have numerous advantages associated therewith. For instance, the diodes may be able to exploit Fermi-level pinning between metal and dielectric to modulate turn-on characteristics. Additionally, the diodes of the memory units may be utilized in back-to-back tunneling arrangements for SCR-type characteristics. Also, band-gap engineered diodes may be utilized on insulators to provide a device structure for cross-point memory cells to reduce cell-to-cell disturbances. In some embodiments, trenched isolation (for instance, shallow trench isolation) may be omitted from a memory array, and oxide may be deposited on flat surfaces as passivation to isolate stacked memory cells from one another. Further, multiple diodes may be configured to provide appropriate current densities to a contact metal for programming efficiency. In some embodiments, silicates may be included in a dielectric stack to increase the density of tunneling states.

Figure 9:
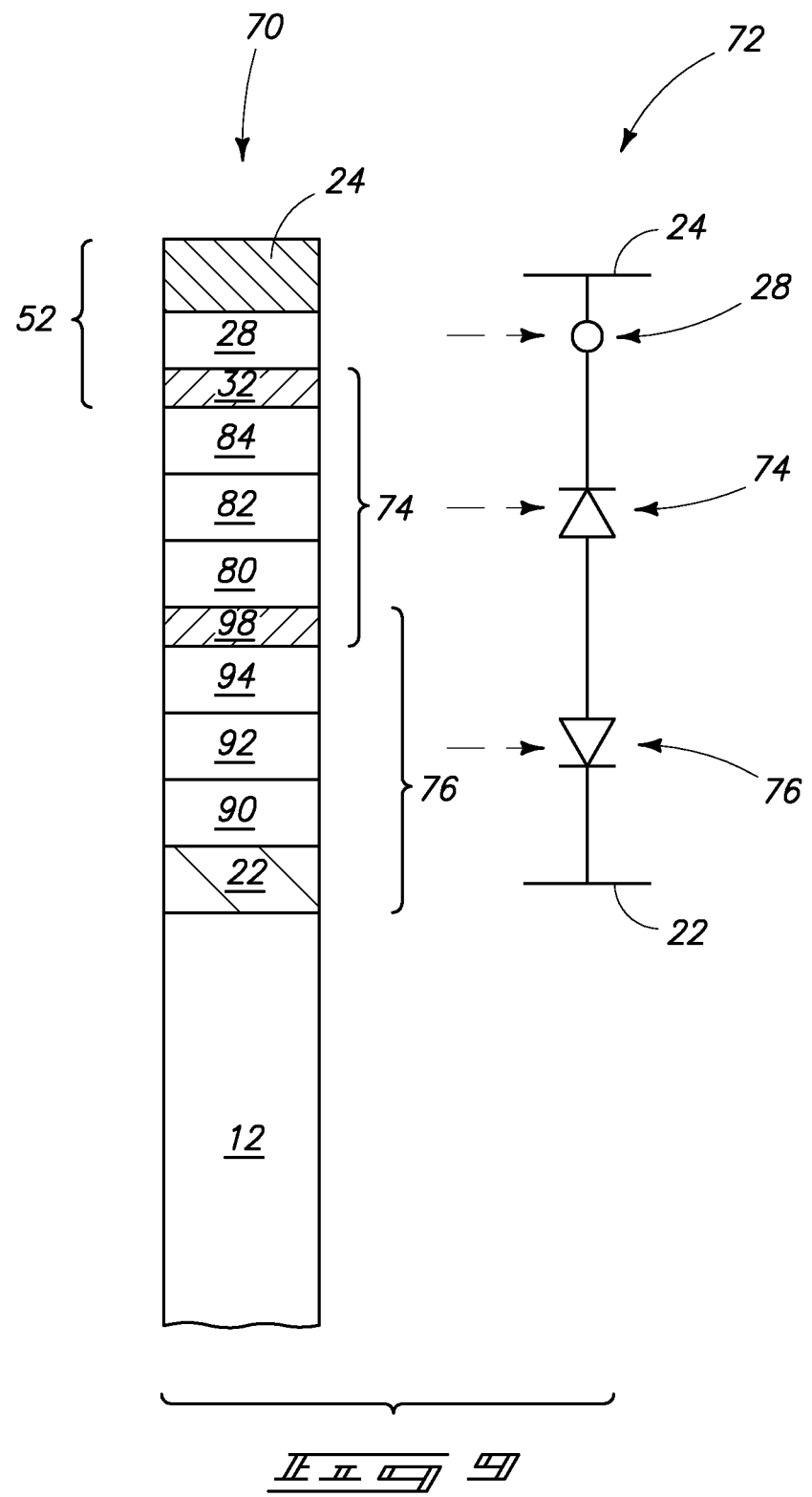
FIG. 9 is diagrammatic cross-sectional view of a portion of a semiconductor construction in accordance with an embodiment.

The memory cells discussed above have planar electrodes. In other embodiments, at least the bottom electrode may be non-planar. The non-planarity of the bottom electrode may increase injection efficiency by increasing the surface area of the bottom electrode. FIG. 9 shows an example cross-point memory cell illustrating an embodiment having a non-planar bottom electrode. The same numbering will be used in referring to FIG. 9 as is utilized above in describing FIG. 5.

The cross-point memory cell 50 of FIG. 9 is formed over a semiconductor base 12. The memory cell comprises the wordline 22, diode dielectric materials 54, 56 and 58, electrically conductive diode material 32, memory element 28 and bitline 24 that were described above with reference to FIG. 5. The bottom electrode 22 of FIG. 9 (in other words, the wordline) is partially recessed into base 12 in the shown embodiment. The bottom electrode may be totally recessed into the base in some embodiments. The portion of the base that the bottom electrode extends into may be any suitable material, and may, for example, be an insulative material such as silicon dioxide, silicon nitride, borophosphosilicate glass, etc.

Figure 10:
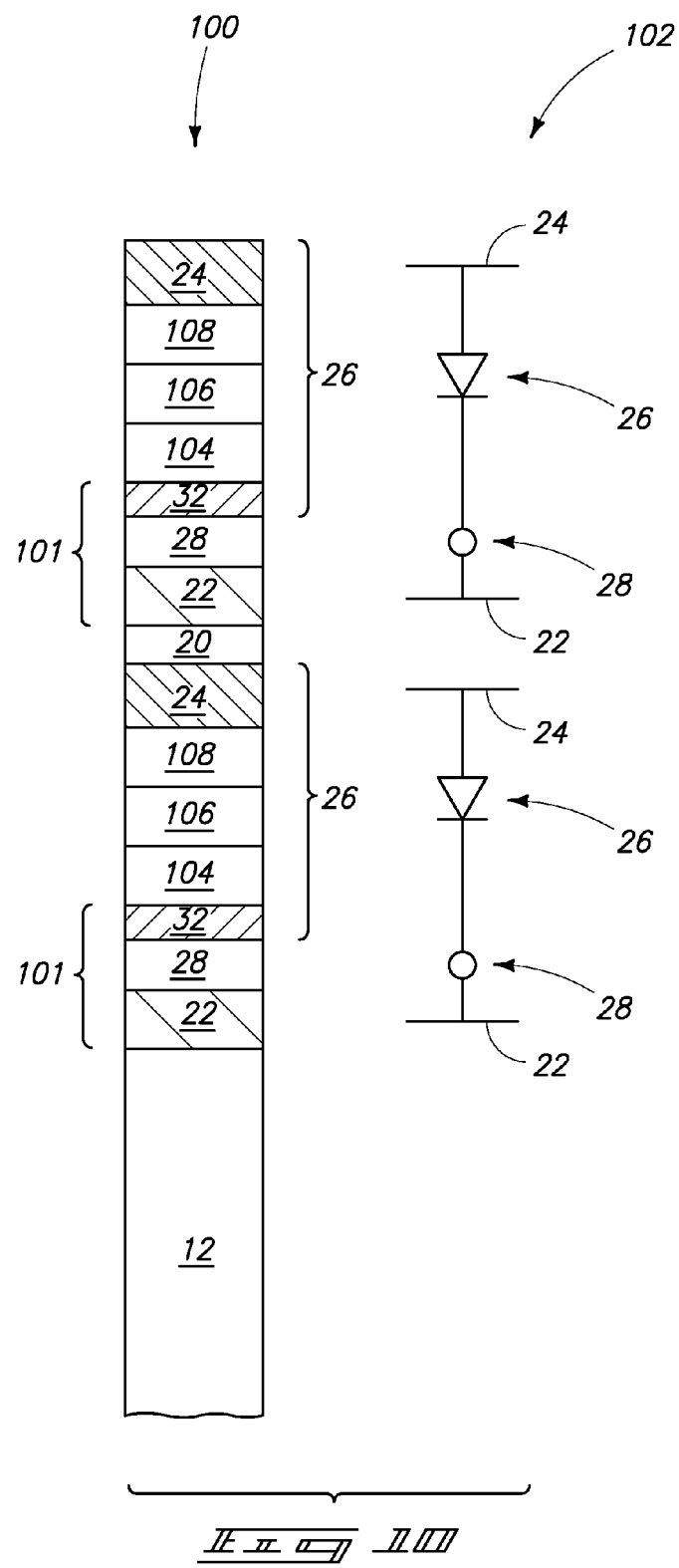
FIG. 10 is diagrammatic cross-sectional view of a portion of a semiconductor construction in accordance with an embodiment.

In some embodiments, multiple diodes may be utilized to achieve desired current density. FIG. 10 shows an example cross-point memory cell illustrating an embodiment having a multiple diodes. The same numbering will be used in referring to FIG. 10 as is utilized above in describing FIG. 5.

The cross-point memory cell 50 of FIG. 10 is formed over a semiconductor base 12. The memory cell comprises the wordline 22, diode dielectric materials 54, 56 and 58, electrically conductive diode material 32, memory element 28 and bitline 24 that were described above with reference to FIG. 5. The diode dielectric materials form three separate parallel diode interconnects between the wordline and the material 32.

The memory cells discussed with reference to FIGS. 1-10 may be utilized in electronic systems, such as computers, etc. In some embodiments, the memory cells may be utilized as non-volatile memory cells and incorporated into flash memory. In some embodiments, the flash memory may be fabricated into flash memory cards.

Figure 11:
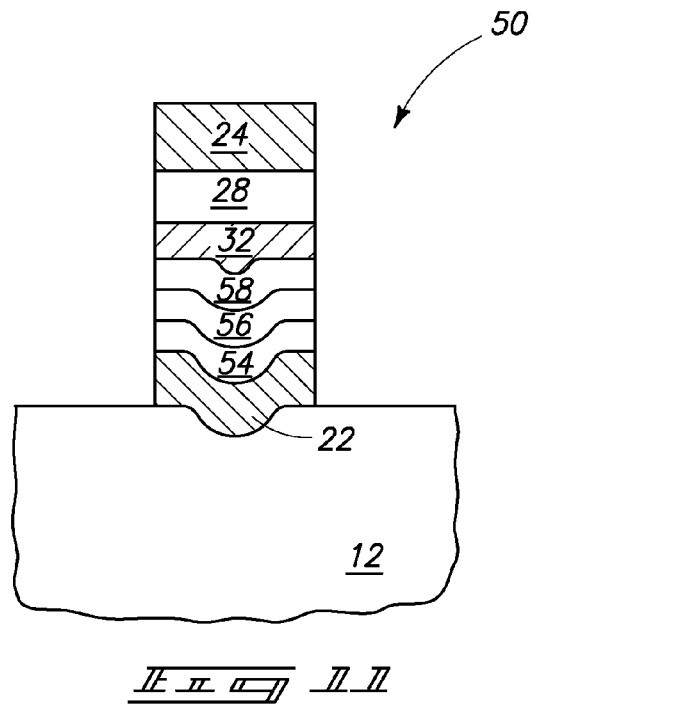
FIG. 11 is diagrammatic cross-sectional view of a portion of a semiconductor construction in accordance with an embodiment.
Figure 12:
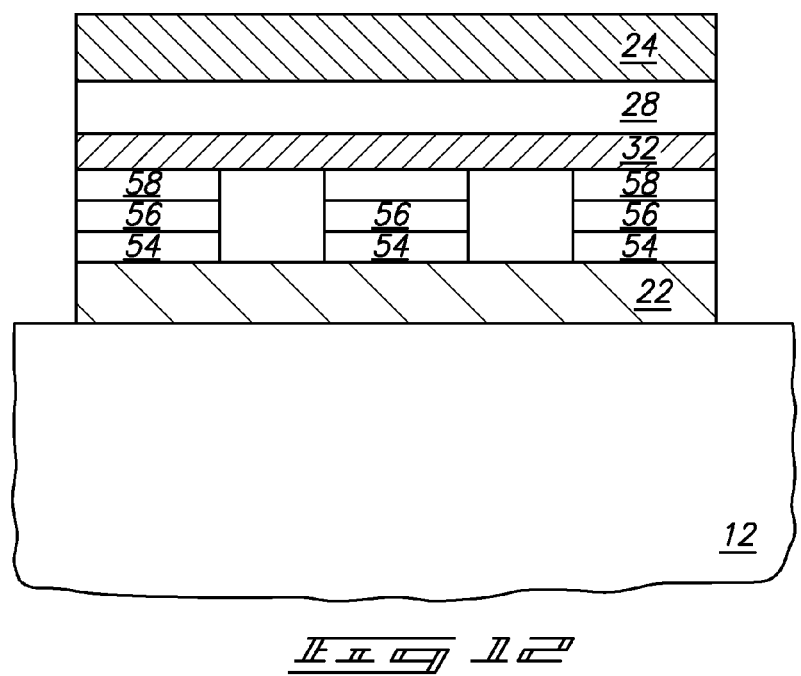
FIG. 12 is diagrammatic cross-sectional view of a portion of a semiconductor construction in accordance with an embodiment.

FIG. 11 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 12. In such block diagram, the addressing circuitry is illustrated as 410 and the read circuitry is illustrated as 412.

Processor device 406 may correspond to a processor module, and associated memory utilized with the module may comprise any of the memory structures discussed with reference to FIGS. 1-10.

Memory device 408 may correspond to a memory module, and may comprise any of the memory structures discussed with reference to FIGS. 1-10.

Figure 13:
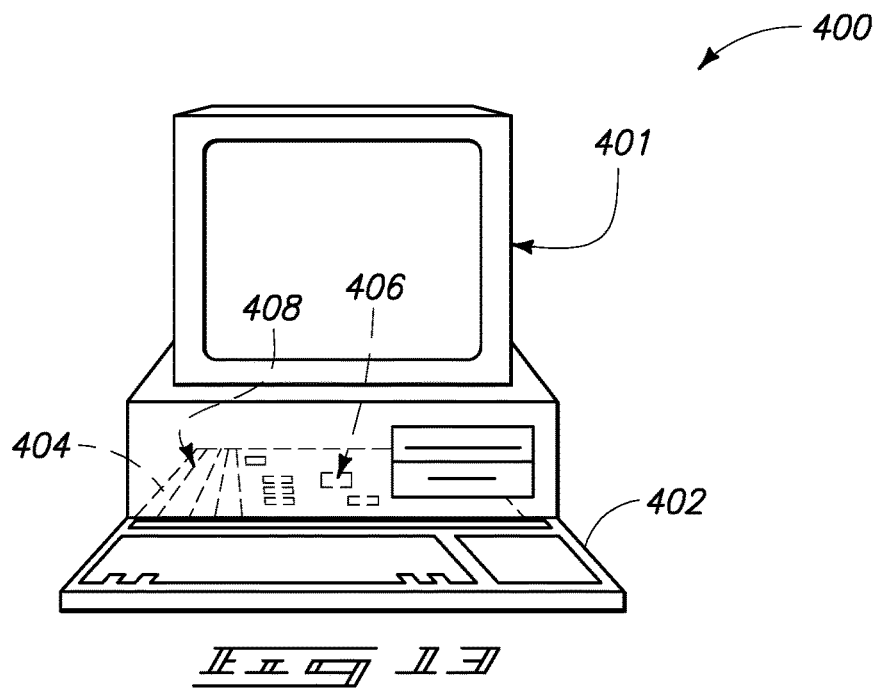
FIG. 13 is a diagrammatic view of a computer embodiment.

FIG. 13 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include any of the memory structures discussed with reference to FIGS. 1-10.

Figure 14:
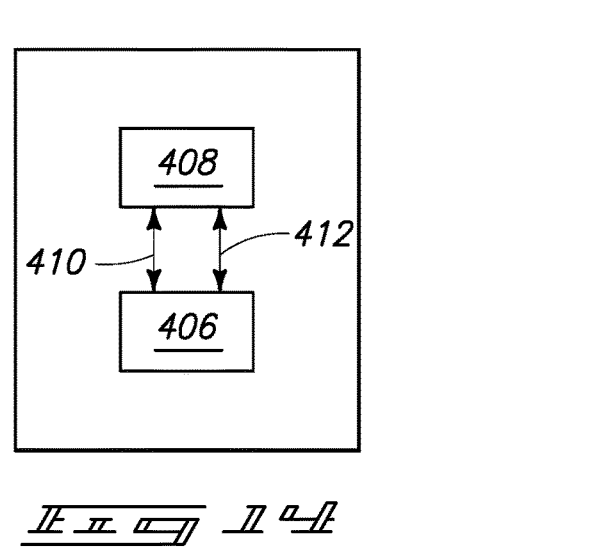
FIG. 14 is a block diagram showing particular features of the motherboard of the FIG. 13 computer embodiment.
Figure 15:
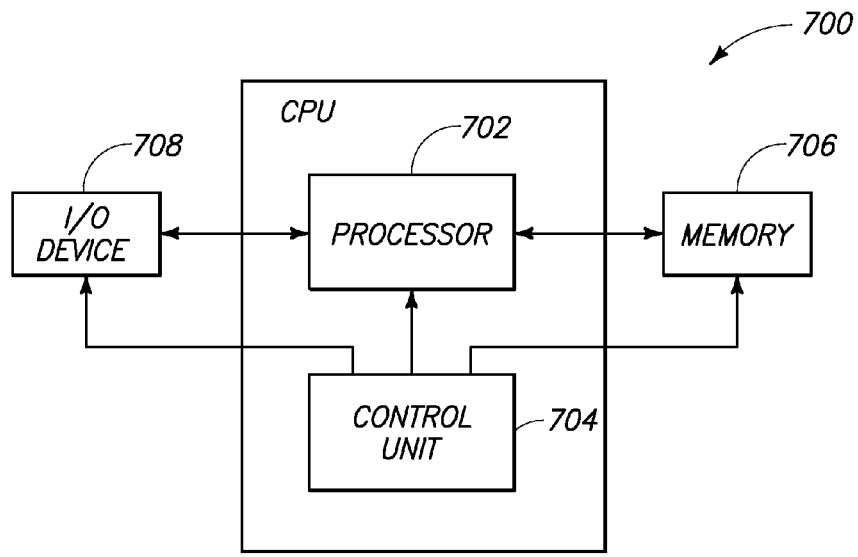
FIG. 15 is a high-level block diagram of an electronic system embodiment.
Figure 16:
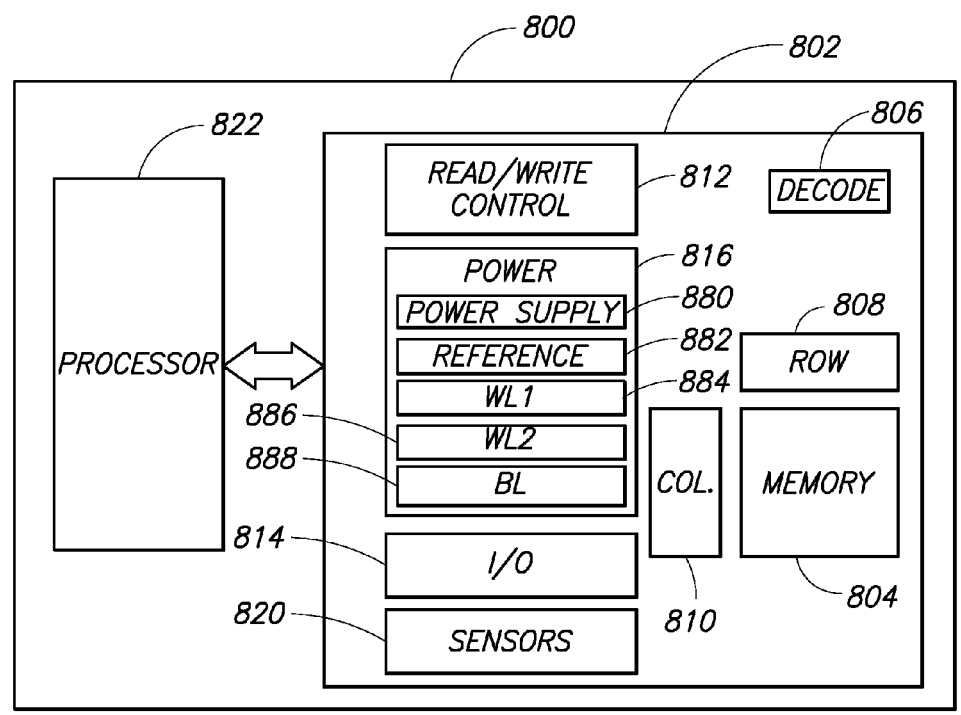
FIG. 16 is a simplified block diagram of an electronic system embodiment.

FIG. 14 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include any of the memory structures discussed with reference to FIGS. 1-10.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a cross-point memory array, comprising:
    forming a first level of wordlines over a semiconductor substrate, the wordlines of the first level of wordlines having non-planar upper and lower surfaces;
    forming a first level of diode dielectric stacks over the first level of wordlines, each of the diode dielectric stacks comprising at least two different dielectric materials in a vertical stack comprising at least three dielectric layers, each of the two different dielectric layers having a different barrier height and being selected from the group consisting of aluminum oxide, silicon oxide, silicon nitride, hafnium oxide and zirconium oxide, a dielectric material nearest the first level of wordlines having the highest barrier height relative to remaining dielectric materials comprised by the diode dielectric stack;
    forming a conductive material over the first level of diode dielectric stacks;
    forming a first level of memory elements over the conductive material the conductive material contacting dielectric material of the first level of dielectric stacks and a memory element material of the first level of memory elements;
    forming a first level of bitlines over the first level of memory elements, the first level of bitlines, first level of memory elements and first level of conductive material forming a first level array of memory components;
    forming a second level of wordlines over the first level of bitlines;
    forming a second level of diode dielectric stacks over the second level of wordlines;
    forming a second level of memory elements over the second level of diode dielectric stacks; and
    forming a second level of bitlines over the second level of memory elements.

2. The method of claim 1 wherein each of the first and second diode dielectric stacks comprises two different dielectric materials.

3. The method of claim 1 wherein at least one of the first and second diode dielectric stacks comprises at least three different dielectric materials.

4. The method of claim 1 wherein at least one of the first and second diode dielectric stacks consists of three different dielectric materials.

5. The method of claim 1 wherein the first and second diode dielectric stacks are the same in composition as one another.

6. A method of forming a cross-point memory array, comprising:
    forming a first level of wordlines over a semiconductor substrate, the first level of wordlines having non-planar upper and lower surfaces;
    forming a first level of memory elements over the first level of wordlines;
    forming a first level of conductive material over and in contact with the first level of memory elements; the first level of wordlines, the first level of memory elements and the first level of conductive material forming a first level of memory components;
    forming a first level of diode dielectric stacks over and in contact with the first level of conductive material, diode dielectric stacks comprising at least two different dielectric materials in a vertical stack comprising at least three dielectric layers, each of the two different dielectric layers being selected from the group consisting of aluminum oxide, silicon oxide, silicon nitride, hafnium oxide and zirconium oxide;
    forming a first level of bitlines over the first level of diode dielectric stacks;
    forming a second level of wordlines over the first level of bitlines;
    forming a second level of memory elements over the second level of word tines;
    forming a second level of diode dielectric stacks over the second level of memory elements; and
    forming a second level of bitlines over the second level of diode dielectric stacks.

7. The method of claim 6 wherein each of the first and second diode dielectric stacks comprises two different dielectric materials.

8. The method of claim 6 wherein at least one of the first and second diode dielectric stacks comprises at least three different dielectric materials.

9. The method of claim 6 wherein at least one of the first and second diode dielectric stacks consists of three different dielectric materials.

10. The method of claim 6 wherein the first and second diode dielectric stacks are the same in composition as one another.

11. A semiconductor construction comprising a vertical stack of memory units over a semiconductor substrate;
individual memory units each comprising:
a memory element;
a wordline having non-planar upper and lower surfaces;
a bitline; and
at least one diode comprising a first electrode conductive material that is also part of the memory element, a dielectric stack and a second electrode conductive material, the first electrode conductive material being in direct physical contact with the dielectric stack and the memory element, the first electrode conductive material containing a metal and the second electrode conductive material being free of the metal, the dielectric stack comprising at least two different dielectric materials having differing barrier heights in a vertical stack comprising at least three dielectric layers, each of the two different dielectric layers being selected from the group consisting of aluminum oxide, silicon oxide, silicon nitride, hafnium oxide and zirconium oxide, a first of the two different dielectric materials having a lowest barrier height relative to all other dielectric materials comprised by the dielectric stack and being disposed closest to the first electrode conductive material.

12. The construction of claim 11 wherein wordlines are at least partially recessed within an insulative material.

13. The construction of claim 11 wherein diodes of individual memory units are between bitlines and memory elements.

14. The construction of claim 13 wherein the bitlines comprise one or more of tantalum, platinum, tungsten, aluminum, copper, gold and conductively-doped silicon.

15. The construction of claim 11 wherein diodes of individual memory units are between wordlines and memory elements.

16. The construction of claim 15 wherein the wordlines comprise one or more of tantalum, platinum, tungsten, aluminum, copper, gold and conductively-doped silicon.

17. The construction of claim 11 wherein each memory unit comprises only one diode.

18. The construction of claim 11 wherein each memory unit comprises a plurality of parallel diodes.

* * * * *

UNITED STATES PATENT AND TRADEMARK OFFICE
CERTIFICATE OF CORRECTION

PATENT NO.        : 9,614,006 B2
APPLICATION NO.   : 14/865806
DATED             : April 4, 2017
INVENTOR(S)       : Mouli Page 1 of 1

It is certified that error appears in the above-identified patent and that said Letters Patent is hereby corrected as shown below:

In the Claims

Column 12, Line 60 Claim 6 – Replace "level of word tines" with --level of wordlines--

Signed and Sealed this
Twenty-third Day of May, 2017

Michelle K. Lee
*Director of the United States Patent and Trademark Office*